(12) United States Patent
Nirmalraj

(10) Patent No.: US 10,307,789 B2
(45) Date of Patent: Jun. 4, 2019

(54) STRUCTURE COMPRISING A 2-DIMENSIONAL MATERIAL

(71) Applicant: International Business Machines Corporation, Armonk, NY (US)

(72) Inventor: Pio Peter Niraj Nirmalraj, Zurich (CH)

(73) Assignee: International Business Machines Corporation, Armonk, NY (US)

(*) Notice: Subject to any disclaimer, the term of this patent is extended or adjusted under 35 U.S.C. 154(b) by 598 days.

(21) Appl. No.: 14/887,163

(22) Filed: Oct. 19, 2015

(65) Prior Publication Data

US 2017/0110538 A1    Apr. 20, 2017

(51) Int. Cl.
| | | |
|---|---|---|
| B05D 7/00 | (2006.01) | |
| H01L 29/24 | (2006.01) | |
| H01L 29/20 | (2006.01) | |
| H01L 29/16 | (2006.01) | |
| H01L 29/51 | (2006.01) | |
| H01L 29/778 | (2006.01) | |
| H01L 51/00 | (2006.01) | |

(52) U.S. Cl.
CPC ............ B05D 7/52 (2013.01); H01L 29/1606 (2013.01); H01L 29/2003 (2013.01); H01L 29/24 (2013.01); H01L 29/51 (2013.01); H01L 29/778 (2013.01); H01L 51/00 (2013.01); B05D 7/50 (2013.01); B05D 2202/00 (2013.01); B05D 2350/60 (2013.01)

(58) Field of Classification Search
None
See application file for complete search history.

(56) References Cited

U.S. PATENT DOCUMENTS

| | | | |
|---|---|---|---|
| 8,449,293 | B2 | 5/2013 | Rathsack et al. |
| 2007/0194386 | A1* | 8/2007 | Hahn ............... H01L 51/105 257/368 |
| 2008/0105866 | A1* | 5/2008 | Jeong ................ C07F 9/14 257/40 |
| 2012/0058350 | A1* | 3/2012 | Long ................. B82Y 10/00 428/446 |
| 2012/0107562 | A1* | 5/2012 | Bolotin ............. B81C 1/00595 428/156 |
| 2014/0127488 | A1 | 5/2014 | Zhamu et al. |
| 2014/0319655 | A1 | 10/2014 | Sparta' et al. |
| 2015/0065688 | A1 | 3/2015 | Ragan et al. |

* cited by examiner

*Primary Examiner* — Michael P. Rodriguez
(74) *Attorney, Agent, or Firm* — Daniel P. Morris, Esq.; Hoffmann & Baron, LLP

(57) ABSTRACT

A method is provided for fabricating a structure including a two-dimensional material. The method includes a step of providing an electrically-conducting substrate and a step of forming a solid organic spacer layer on the electrically-conducting substrate. The method further includes depositing the two-dimensional material on the spacer layer. A structure formed according to the method includes an electrically-conducting substrate and a layer of a two-dimensional material. A solid organic spacer layer is arranged between the electrically-conducting substrate and the layer of the two-dimensional material.

10 Claims, 4 Drawing Sheets

STRUCTURE COMPRISING A 2-DIMENSIONAL MATERIAL

BACKGROUND

The present invention relates generally to method for fabrication semiconductor structures and the structures formed thereby, and more particularly to techniques for fabricating a semiconductor structure including two-dimensional material.

Two-dimensional materials, also denoted as 2D materials or single layer materials, are a class of nanomaterials defined by their property of being merely one or two atoms thick. One popular example of a two-dimensional material is graphene, a material constituted by a single layer of carbon atoms arranged in a hexagonal crystal lattice. Two-dimensional materials are considered to have many interesting applications in particular for future semiconductor technologies.

SUMMARY

According to a first embodiment, the present invention is embodied as a method for fabrication of a structure comprising a 2-dimensional material. The method comprises a step of providing an electrically-conducting substrate. The method further comprises a step of forming a solid organic spacer layer on the conducting substrate and a step of depositing the 2-dimensional material on the organic spacer layer.

According to a second embodiment, the invention is embodied as a structure which comprises an electrically-conducting substrate, a layer of a 2-dimensional material and a solid organic spacer layer arranged between the conducting substrate and the layer of 2-dimensional material.

According to another embodiment, the invention is embodied as an electronic device comprising a structure according to the second embodiment.

Devices and methods embodying the present invention will now be described, by way of non-limiting examples, and in reference to the accompanying drawings. Technical features depicted in the drawings are not necessarily to scale. Also some parts may be depicted as being not in contact to ease the understanding of the drawings, whereas they may very well be meant to be in contact, in operation.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative techniques for fabricating a semiconductor structure comprising a two-dimensional material. It is to be appreciated, however, that the invention is not limited to the specific apparatus and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

In reference to FIGS. 1-7, general aspects of the invention and corresponding terms are first described.

As previously stated, embodiments of the invention relate to a method for fabricating a structure comprising a two-dimensional material and the structure formed thereby. Two-dimensional materials, also denoted as 2D materials, may be defined as a class of materials, more particularly a class of nanomaterials, defined by their property of being merely one or two atoms thick. One popular example of a 2-dimensional material is graphene, a material constituted by a single layer of carbon atoms arranged in a hexagonal crystal lattice. Two-dimensional materials are considered to have many interesting applications in particular for future semiconductor technologies.

Two-dimensional materials are usually not completely atomically flat. They are composed of internal ripples, wrinkles at domain boundaries and are wavy in nature. Furthermore, the surface roughness of the 2-dimensional material is influenced by the quality and roughness parameter of the underlying surface. Embodiments of the invention provide fabrication methods for 2-dimensional materials by which the surface roughness of the 2-dimensional materials can be effectively reduced, resulting in structures comprising 2-dimensional materials with highly smooth and flat surfaces.

Figure 1:
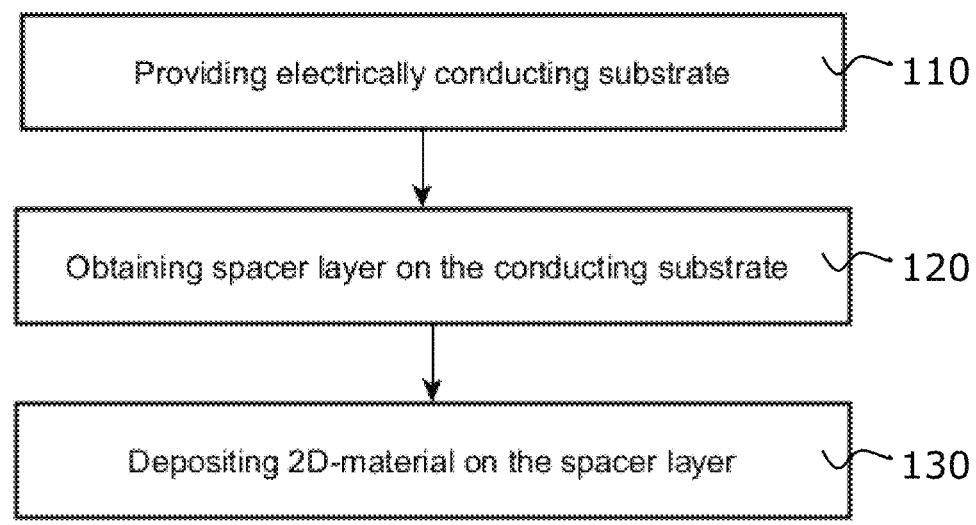
FIG. 1 is a flow chart illustrating basic method steps of an exemplary method according to an embodiment of the invention.

FIG. 1 shows a flow chart of basic method steps according to an embodiment of the invention. In step 110, an electrically-conducting substrate is provided. The electrically-conducting substrate may be a metal substrate or a semiconductor substrate. More particularly, the electrically-conducting substrate may be embodied as a substrate comprising gold (Au), palladium (Pd), platinum (Pt), copper (Cu), germanium (Ge) and/or silicon (Si).

In step 120, a solid organic spacer layer is obtained (i.e., formed) on the conducting substrate. The solid organic spacer layer may be in particular formed as a monolayer of organic molecules; i.e., that it only comprises a single layer of organic molecules. The solid organic spacer layer may comprise alkane molecules ($C_aH_{2n+2}$), cycloalkane molecules ($C_nH_{2n}$), alkyl organic molecules (X—$C_nH_{2n+1}$) and/or thiol molecules. The alkane, cycloalkane, alkyl and thiol molecules preferably have a chain length of the carbon atoms between C20 and C100. This corresponds to a preferred approximate molecular length ranging from about 3.5 nm to 50 nm.

Then in step 130, the 2-dimensional material is deposited on the spacer layer. According to preferred embodiments, graphene, transition metal dichalcogenide (TMD), molybdenum disulfide ($MoS_2$); tungsten disulfide ($WS_2$); tungsten diselenide ($WS_{e2}$) and boron nitride (BN) may be used as the 2-dimensional material.

Figure 2:
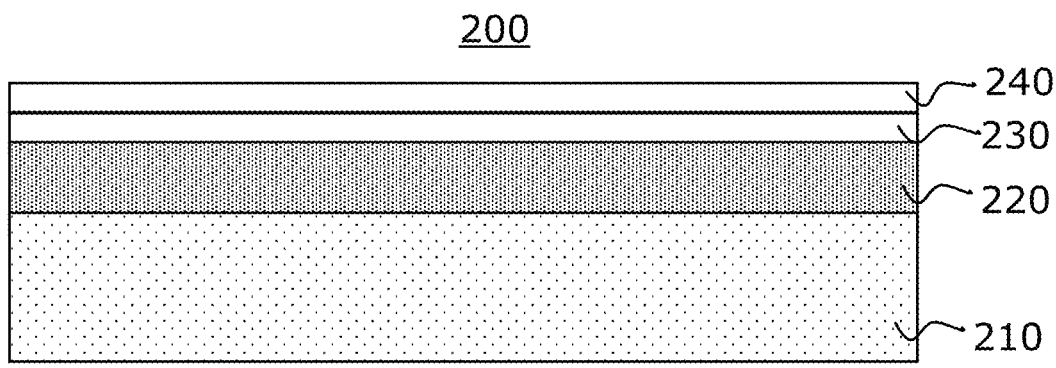
FIG. 2 is a cross-sectional view depicting at least a portion of an exemplary semiconductor structure according to an embodiment of the invention.

FIG. 2 shows at least a portion of an exemplary structure 200 according to an embodiment of the invention. The structure 200 may be fabricated by a method as described with reference to FIG. 1 above or FIG. 3 below.

The structure 200 comprises a support substrate 210. The support substrate 210 may be embodied as a substrate comprising or consisting of silicon (Si), micas, plastics or calcium fluoride (CaF2). Mica can be described by the general chemical formula $X_2Y_{4-6}Z_8O_{20}(OH,F)_4$, in which:

X is K, Na, or Ca or less commonly Ba, Rb, or Cs;

Y is Al, Mg, or Fe or less commonly Mn, Cr, Ti, Li;

Z is chiefly Si or Al, but also may include Fe3+ or Ti.

On at least a portion of the support substrate 210 there is arranged an electrically-conducting substrate 220. The electrically-conducting substrate 220 may generally be embodied as a metal or a semiconductor substrate. More particularly, the electrically-conducting substrate 220 may be embodied as a substrate comprising gold (Au), palladium (Pd), platinum (Pt), copper (Cu), germanium (Ge) and/or silicon.

In one or more embodiments, on at least a portion of the electrically-conducting substrate 220 there is arranged a solid organic spacer layer 230. The solid organic spacer layer 230 may generally be embodied as any solid layer that comprises organic molecules. The organic molecules may be embodied as alkanes $C_nH_{2n+1}$), cycloalkanes ($C_nH_{2n}$) and/or alkyl organic molecules (X—$C_nH_{2n+1}$). Furthermore, the organic molecules may be embodied as thiols. As a further example, molecules with the structural arrangement HS(CH2)4CONH(CH2)2R) can be used to self-assemble on metal surfaces as reported in F. Mirjani, et al. "Charge Transport Across Insulating Self-Assembled Monolayers: Non-equilibrium Approaches and Modeling To Relate Current and Molecular Structure," *ACS Nano*, Vol. 8, Issue 12, (2014), pp. 12428-12436, the disclosure of which in incorporated herein by reference in its entirety for all purposes.

The solid organic spacer layer 230 is preferably a monolayer comprising a single layer of organic molecules. According to one or more embodiments, the alkane, cycloalkane, alkyl and thiol organic molecules have a chain length between C20 and C100. With an appropriate selection of the length of the organic molecules, the stability of the organic spacer layer can be tuned. In one or more embodiments, the chain length of the molecules is in a range between about 3.5 nm and 50 nm.

On at least a portion of the solid organic spacer layer 230 there is arranged a layer 240 of a 2-dimensional material.

According to one or more embodiments, the 2-dimensional material is graphene, transition metal dichalcogenide (TMD), $MoS_2$, $WS_2$, $WS_{e2}$ or BN.

The spacer layer 230 is configured to provide lower adhesion forces to the layer of the 2-dimensional material 240 than to the electrically-conducting substrate 220. According to embodiments, the adhesion forces between the electrically-conducting substrate 220 and the solid organic spacer layer 230 are predominantly van der Waals forces. The adhesion forces between the electrically-conducting substrate 230 and the layer 240 of the 2-dimensional material are also predominantly van der Waals forces according to embodiments.

If one compares the adhesion forces between the layer 240 of the 2-dimensional material and the solid organic spacer layer 230, these adhesion forces are significantly lower than the adhesion forces that would appear in a structure in which a layer of a 2-dimensional material is directly arranged on an electrically-conducting substrate, in particular on a conducting substrate of metal. In this respect, by providing the solid organic spacer layer 230 the adhesion forces acting on the 2-dimensional material 240 are reduced compared with a structure that comprise a 2-dimensional material that is directly attached to a metal or semiconducting surface. In other words, the function of the organic spacer layer 230 may be considered as a "cushioning" layer" that provides a kind of soft landing pad or gentle carpet for the layer 240 of the 2-dimensional material.

By providing the organic spacer layer 230 between the 2-dimensional material layer 240 and the electrically-conducting substrate 220 the surface roughness of the 2-dimensional material layer 240 may be significantly reduced. In addition, the organic spacer layer 230 may facilitate the suppression of internal ripples in the layer 240 of the 2-dimensional material. As a result, the structure 200 may provide an extremely flat and extremely smooth layer of a 2-dimensional material.

In other words, the organic spacer layer 230 facilitates a rather weak physisorption as interaction energy between the organic spacer layer 230 and the layer of the 2-dimensional material 240, while the interaction energy between the electrically-conducting substrate 220 and the organic spacer layer 230 is a rather strong physisorption due the electronic nature of the electrically-conducting substrate 220.

For fabricating extremely smooth and extremely flat 2-dimensional materials, the surface roughness of the electrically-conducting substrate 220 and the surface roughness of the organic spacer layer 230 is carefully selected and processed according to embodiments of the invention.

In this respect, according to embodiments, the electrically-conducting substrate 220 has a root-mean-square surface roughness RRMS of less than 1 nm, and preferably of less than 0.6 nm.

Furthermore, according to embodiments, the organic spacer layer 230 has a root-mean-square surface roughness RRMS of less than 2 nm, preferably of less than 1 nm.

With these parameters of the surface roughness of the electrically-conducting substrate 220 and the organic spacer layer 230, the layer 240 of the 2-dimensional material may be provided with a root-mean-square surface roughness RRMS of less than 1 nm, preferably of less than 0.5 nm.

The thickness of the organic spacer layer 230 is given by the length and width of the organic molecules and whether they are lying down or standing up. According to embodiments, the thickness of the organic layer is less than 1 nm. Alkanes usually lie down, resulting in a thickness of the organic layer of approximately 3.5 Angstrom.

The thickness of the layer of the 2D material again depends on the thickness of the 2D material. As an example, for graphene it is about 0.35 nm, for $MoS_2$ it is about 0.7 nm, for $WS_2$ and $WS_{e2}$ it is about 0.8 nm and for BN it is about 0.8 nm.

Figure 3:
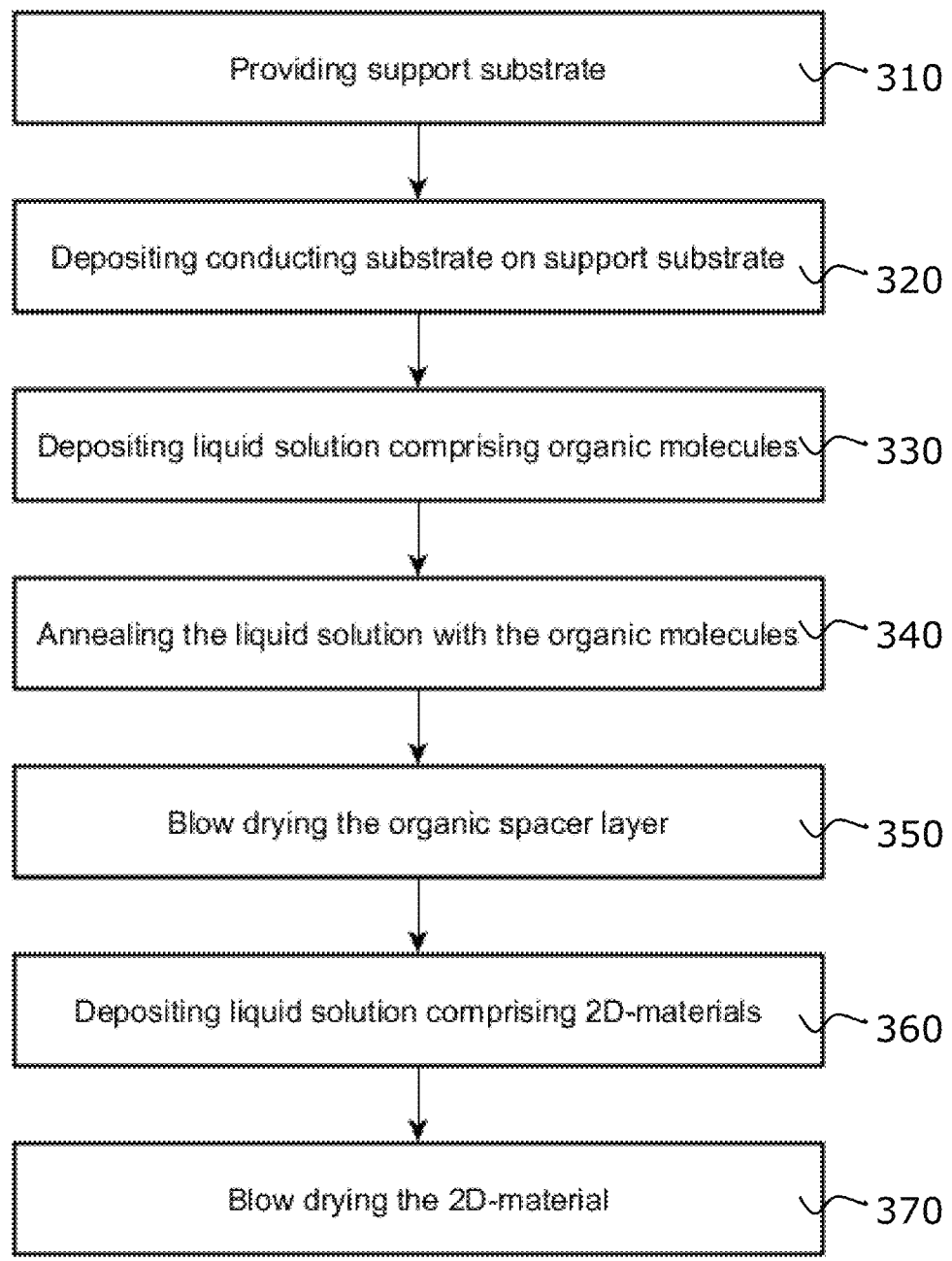
FIG. 3 shows a flow chart of an exemplary method according to an embodiment of the invention.

FIG. 3 shows a flow chart of an exemplary method according to an embodiment of the invention in more detail. By way of illustration, details of an exemplary process for fabricating a structure according to embodiments of the invention are described in the following.

In step 310, the support substrate 210 is provided. The support substrate 210 may be embodied as a substrate of silicon (Si), micas, plastics or calcium fluoride ($CaF_2$).

In step 320, the electrically-conducting substrate 220 is deposited on the support substrate 210. This could, for example, e.g. be performed by thermal evaporation of a metallic film on the support substrate 210. In order to achieve a predefined maximum surface roughness, the metallic film may be deposited with a sufficiently high temperature, preferably at a temperature of about 400-570 degrees Celsius (° C.).

The step 120 of obtaining (i.e., forming) a solid organic buffer layer as described with reference to FIG. 1 comprises, according to this illustrative embodiment, three separate steps or sub-steps:

In step 330, a liquid solution comprising organic molecules solubilized in a solvent is deposited on the electrically-conducting substrate 220. The deposition of the liquid solution is preferably done by spraying the liquid solution on the electrically-conducting substrate 220. Such a spray deposition has the advantage to be readily scalable. But generally also other methods for depositing the liquid solution may be used, e.g. drop casting or dip coating.

The liquid solution may, for example, be prepared as a stock solution of the organic spacer molecules comprising, for example, alkyl molecules with a chain length from C20-C100 solubilized by mixing the molecules in powder form with the solvent 1-phenyloctane at a concentration of 0.1 mM.

This stock solution is then used as the solution that will be sprayed. For achieving a homogeneous organic spacer layer that is tightly packed on the surface of the electrically-conducting substrate 220, the following steps may be employed:

1 mL of the stock solution is fed into a spray gun cup. The nozzle of the spray gun is chosen sufficiently small, e.g. 0.1 mm to obtain a fine spray. The spray deposition is performed at an appropriate gas (nitrogen/argon) pressure, such as, for example, 1.5 mbar. The spray gun is held at an oblique angle from the surface of the conducting substrate 220 during deposition. The distance between the spray nozzle and the conducting substrate is preferably between 10 centimeters (cm) and 20 cm for achieving fine coating of the organic material over the surface of the conducting substrate 220. The entire spray deposition is performed under a ventilated fume cupboard. Two passes, including a forward pass and a reverse pass, of 1 milliliter (mL) of the liquid solution comprising the organic molecules is used to fully coat a 1 square centimeter ($cm^2$) surface; e.g., a metal surface of the electrically-conducting substrate. The deposited quantity is critical and should be chosen carefully to avoid material flooding and the formation of multi-layered structures of organic molecules. The surface of the conducting substrate is held at room-temperature during spray deposition for homogeneous coating.

Then in step 340, the liquid solution, embodied as a molecular film on the surface of the conducting substrate 220, is annealed at 30° C. for 15 minutes to remove the solvent. This creates a solid, densely-packed organic spacer layer 230 comprising a monolayer of organic molecules.

Next, in step 350, the organic spacer layer 230 is blown-dry, for example with $N_2$ gas at a pressure of about 1 mbar. This step is performed to clean the organic spacer layer 230.

The resulting organic spacer layer 230 has a clean and closely-packed, self-assembled molecular monolayer structure on the surface of the conducting substrate 230.

This may be confirmed using high-resolution ellipsometry, atomic force microscopy and/or scanning tunneling microscopy.

In a subsequent step 360, a liquid solution comprising the 2D-materials solubilized in a solvent is deposited on the organic spacer layer 230. This step may be in particular performed by spraying the solution comprising the 2-dimensional material on the organic spacer layer 230. Such a spray deposition has the advantage of being readily scalable. But generally also other methods for depositing the liquid solution may be used, e.g. drop casting or dip coating.

According to a preferred embodiment, isopropyl alcohol and water-based liquids with low boiling points can be used as solvent to exfoliate and sustain the 2D-materials.

Generally, the same model of the spray gun that was used for depositing the organic molecules can be used for spraying of the 2D-material, according to one or more embodiments. However, separate spray guns of the same model should be used to avoid material intermixing and contamination at the spray nozzle.

The nozzle of the spray gun is again chosen sufficiently small, e.g. about 0.1 mm, to obtain a fine spray. The spray deposition is performed at an appropriate gas (nitrogen/argon) pressure of, for example, 2 mbar. The spray gun is held at an oblique angle from the surface of the organic spacer layer 230. The distance between the spray nozzle and the organic spacer layer 230 should be appropriately chosen for achieving a fine coating of the 2D-material on the organic spacer layer 230 adsorbed on the conducting substrate 220. A preferred distance is about 5 cm to 10 cm. The entire spray deposition is again performed under a ventilated fume cupboard.

In step 370, the sample with the 2-dimensional material on the organic spacer layer 230 is blown dry with $N_2$ gas at a pressure of about 1 mbar. This step is again performed for cleaning purposes.

In view of the low boiling points of the water-based liquids that are typically used as solvents for the 2-dimensional materials, no annealing step is required. However, an annealing step may optionally be performed before the blow drying step. In such a case the annealing temperature should be chosen appropriately to avoid any harm to the layer of the 2-dimensional material or the underlying organic layer. Typically any harm/disintegration can be avoided if the thermal treatment is performed below about 50° C.

The steps 360 and 370 establish a more detailed embodiment of the step 130 of depositing a 2-dimensional material on the spacer layer.

The step 330 of depositing a liquid solution comprising organic molecules, the step 340 of annealing the liquid solution, the step 350 of blow drying the organic spacer layer, the step 360 of depositing the liquid solution comprising the 2-dimensional material and the step 370 of blow drying the 2-dimensional material can all be performed at 10° C. to 40° C.; hence at room temperature under ambient conditions. This temperature range offers a lot of flexibility and freedom and eases the fabrication process. In particular, it allows the use of various support substrates that may be sensitive to the application of higher temperatures. The steps 330 through 370 can be easily employed without using any dangerous materials. The steps 330 through 370 according to embodiments of the invention can be performed fast, scalable and inexpensive and do not require highly specialized and expensive equipment. A usual run of the steps 330 through 370 only requires approximately 15 minutes in total, according to one or more embodiments of the invention.

As a preferred example, metal thin films as conducting substrate 220 can be used on plastics as support substrate 210. Such a structure may be used e.g. as a basis for organic transistor applications.

With the methods described above, 2-dimensional materials with highly smooth and highly flat nano-sheets on metal or semiconducting surfaces can be provided.

Figure 4A:
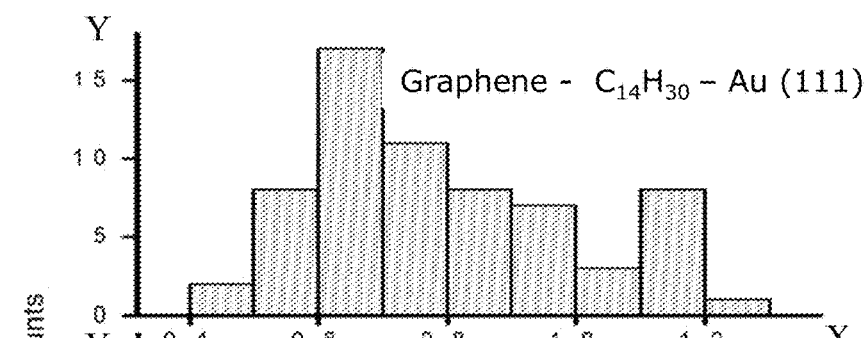
FIG. 4A shows statistically generated data based on Atomic Force Microscopy (AFM) images taken from a structure that was fabricated according to a method of an embodiment of the invention.

FIG. 4A shows statistically generated data based on Atomic Force Microscopy (AFM) images taken from a structure that was fabricated according to a method of an embodiment of the invention. The x-axis denotes the interface induced surface roughness in nm and the y-axis denotes the number of counts for the corresponding surface roughness of the x-axis. More particularly, the AFM image was taken from a structure comprising a graphene layer as 2-dimensional material layer, a gold layer in <111> orientation as conducting substrate and a monolayer of $C_{14}H_{30}$ molecules as organic spacer layer.

Figure 4B:
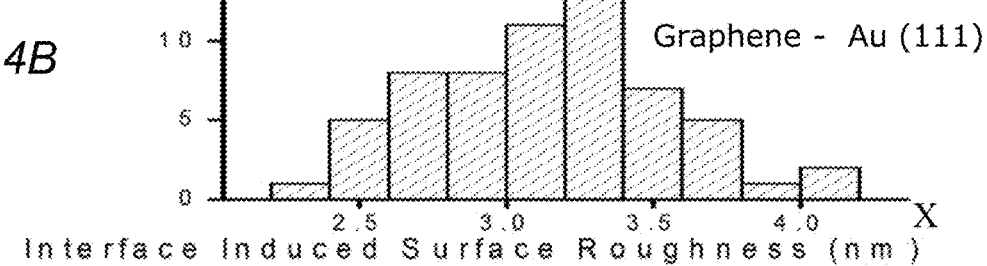
FIG. 4B shows statistically generated data based on Atomic Force Microscopy (AFM) images taken from a structure that was fabricated without an organic spacer layer.

FIG. 4B shows in comparison statistically generated data based on Atomic Force Microscopy (AFM) images taken from a structure that was fabricated without an organic spacer layer. The x-axis denotes again the interface induced surface roughness in nm and the y-axis denotes the number of counts for the corresponding surface roughness of the x-axis. More particularly, the AFM image was taken from a structure comprising a graphene layer as 2-dimensional material layer that is directly deposited on a gold layer in <111> orientation as conducting substrate.

As can be seen from the comparison of FIGS. 4A and 4B, the arrangement of the organic spacer layer comprising the $C_{14}H_{30}$ molecules reduces the surface roughness of the graphene layer significantly by a factor of approximately four. While the root-mean-square surface roughness RRMS of the structure of FIG. 4A is about 0.8 nm, the root-mean-square surface roughness RRMS of the structure of FIG. 4B is about 3.1 nm.

As discussed above, this may be explained by the effect that the adhesion forces acting on the layer of the 2-dimensional material are significantly reduced by the organic spacer layer. The organic spacer layer with the $C_{14}H_{30}$ molecules acts as "cushion," "soft landing pad" or "gentle carpet" for the 2-dimensional material graphene, thereby significantly reducing the surface roughness of the graphene layer.

Figure 5:
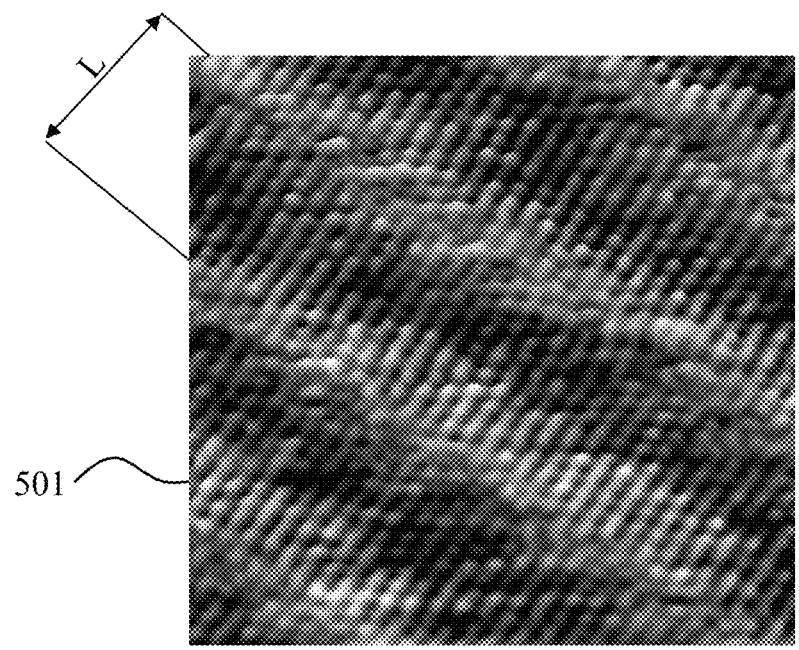
FIG. 5 shows a scanning tunneling microscopy (STM) image of an organic spacer layer of a structure according to an embodiment of the invention.

FIG. 5 shows a scanning tunneling microscopy (STM) image 501 of an organic spacer layer of a structure according to an embodiment of the invention. In this example, the spacer layer comprises alkane organic molecules $C_{30}H_{62}$. The alkane organic molecules n-$C_{30}H_{62}$ have a molecular length of 3.75 nm and the molecules pack with its backbone parallel to the surface of the conducting substrate, which is in this case a metal surface of gold in <111> orientation. The molecule length L is indicated with an arrow. Such linear chain organic molecules are insulating with a dielectric constant of about 2 and are compatible with room-temperature deposition on metal from liquid-phase. In general, both normal and cycloalkanes can be used as spacer layer.

The alkanes with a chain length beyond C20 pack into denser organic spacer layers that are more tightly packed than the alkane molecules with shorter lengths. With an appropriate selection of the chain length, the stability of the organic spacer layer can be tuned.

Figure 6:
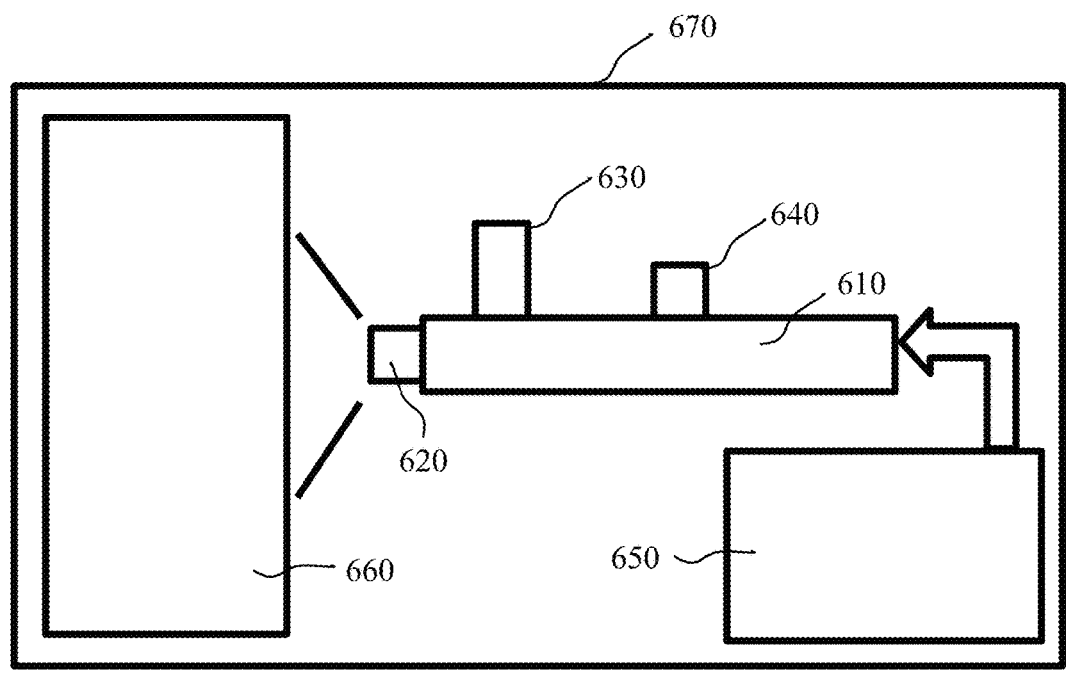
FIG. 6 shows an exemplary embodiment of an apparatus for spray deposition of liquid solutions that can be used to perform the step of spraying the liquid solutions comprising the solubilized organic molecules and the 2-dimensional materials.

FIG. 6 shows an exemplary embodiment of an apparatus 600 for spray deposition of liquid solutions that can be used to perform the steps 330 of spraying the liquid solution comprising the solubilized organic molecules on the electrically-conducting substrate 220 and to perform the step 360 of spraying the solution comprising the 2-dimensional material on the organic spacer layer 230.

The apparatus 600 comprises a spray gun 610 having a nozzle 620, a feed 630 for filling in the liquid solution and a knob 640 for activating the spray gun 610. The apparatus 600 further comprises a device 650 for supplying compressed gas (e.g. $N_2$, Ar) to the spray gun 610 and a table 660 for fixing a sample surface. Furthermore, a ventilated fume cupboard 670 is provided for ensuring consistent ambient conditions during the spray deposition. Upon activation of the knob 640, the liquid solution is sprayed by the compressed gas through the nozzle 620 on a sample arranged on the table 660.

Figure 7:
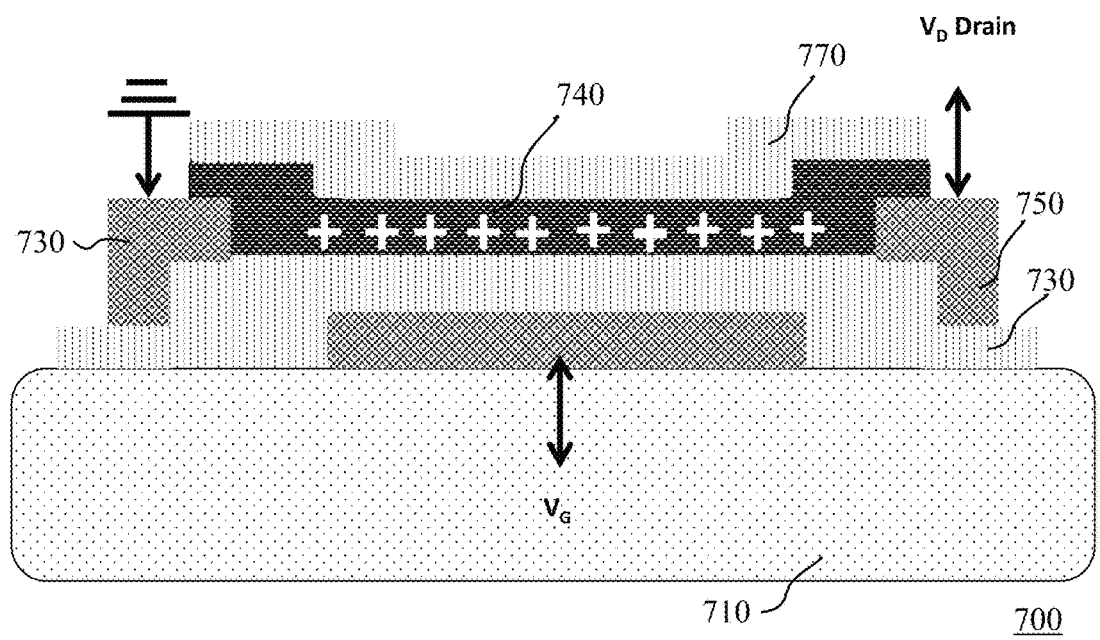
FIG. 7 shows an exemplary embodiment of an electronic device embodied as an organic transistor according to an embodiment of the invention.

FIG. 7 shows at least a portion of an exemplary electronic device embodied as an organic transistor 700, according to an embodiment of the invention. The organic transistor 700 comprises a support substrate 710. The support substrate 710 may be, for example, a substrate of silicon, mica or plastics. On top of the support substrate 710 there is arranged a gate electrode 720. The gate electrode 720 corresponds to the electrically-conducting substrate 220 of FIG. 2. Accordingly, the gate electrode 720 may be a metal or a semiconducting substrate. The gate electrode 720 is covered by an organic dielectric layer 730 corresponding to the organic spacer layer 230 of FIG. 2. The organic dielectric layer 730 may hence be implemented as a monolayer of organic molecules, in particular alkanes, cycloalkanes or alkyl organic molecules. On top of the organic dielectric layer 730 there is arranged a semiconducting channel 740 comprising a layer of a 2-dimensional material corresponding to the layer 240 of FIG. 2. To achieve the semiconducting channel 740, the 2-dimensional material, e.g. a graphene layer, is doped with a p-type material, e.g. nitrogen, graphene oxide, bismuth or antimony.

In addition, the organic transistor 700 comprises a drain electrode 750 and a source electrode 760, preferably made of metal or an alternative conducting material. The 2-dimensional semiconducting channel 740 is covered by a layer 770 of an organic material. This layer may be provided by conventional semiconductor technology, e.g. by vapor phase deposition of pentacene.

While the present invention has been described with reference to a limited number of embodiments, variants and the accompanying drawings, it will be understood by those skilled in the art given the teachings herein that various changes may be made and equivalents may be substituted without departing from the scope of embodiments of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method for fabricating a structure comprising a two-dimensional material, the method comprising the steps of:
   providing an electrically-conducting substrate;
   forming a solid organic spacer layer on the conducting substrate; and
   depositing the two-dimensional material on the spacer layer, the depositing performed at a gas pressure of approximately 2 mbar and utilizing a spray gun having a nozzle diameter of approximately 0.1 mm.

2. The method as recited in claim 1, wherein forming the solid organic spacer layer comprises:
   depositing a liquid solution comprising organic molecules solubilized in a solvent on the conducting substrate; and
   annealing the liquid solution to remove the solvent and create the solid organic spacer layer.

3. The method as recited in claim 2, wherein depositing the liquid solution comprises spraying the liquid solution comprising the solubilized organic molecules on the electrically-conducting substrate.

4. The method as recited in claim 1, wherein depositing the two-dimensional material comprises depositing a liquid solution comprising the two-dimensional material solubilized in a solvent.

5. The method as recited in claim 1, wherein the steps of forming the solid organic spacer layer on the conducting substrate and depositing the two-dimensional material on the spacer layer are performed at a temperature of between 10° C. and 40° C.

6. The method as recited in claim 1, wherein the conducting substrate comprises one of a metal and a semiconductor.

7. The method as recited in claim 1, wherein the spacer layer is a monolayer of organic molecules.

8. The method as recited in claim 1, wherein the spacer layer comprises organic molecules selected from the group consisting of alkanes ($CnH_{2n+2}$), cycloalkanes ($C_nH_{2n}$), alkyl organic molecules, and thiols.

9. The method as recited in claim 8, wherein the alkane, cycloalkane, alkyl and thiol organic molecules have a chain length between C20 and C100.

10. The method as recited in claim 1, wherein the two-dimensional material is selected from the group consisting of graphene, transition metal dichalcogenide (TMD), $MoS_2$, $WS_2$, $WSe_2$ and BN.

* * * * *